US010529957B2

(12) United States Patent
Song et al.

(10) Patent No.: US 10,529,957 B2
(45) Date of Patent: Jan. 7, 2020

(54) ORGANIC LIGHT EMITTING DIODE DISPLAY AND MANUFACTURING METHOD THEREOF

(71) Applicant: Samsung Display Co., Ltd., Yongin-si (KR)

(72) Inventors: A Ree Song, Seoul (KR); Byeong-Hee Won, Hwaseong-si (KR); Jong In Baek, Suwon-si (KR); Won Sang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/054,095

(22) Filed: Aug. 3, 2018

(65) Prior Publication Data

US 2018/0342709 A1    Nov. 29, 2018

Related U.S. Application Data

(63) Continuation of application No. 14/966,629, filed on Dec. 11, 2015, now Pat. No. 10,044,004.

(30) Foreign Application Priority Data

Jul. 28, 2015    (KR) .................. 10-2015-0106759

(51) Int. Cl.
*H01L 51/56*    (2006.01)
*H01L 27/32*    (2006.01)
*H01L 51/52*    (2006.01)

(52) U.S. Cl.
CPC .......... *H01L 51/56* (2013.01); *H01L 27/3213* (2013.01); *H01L 27/3218* (2013.01);
(Continued)

(58) Field of Classification Search
CPC .......... H01L 2251/558; H01L 27/3213; H01L 27/3216; H01L 27/3218; H01L 51/5265; H01L 51/56
See application file for complete search history.

(56) References Cited

U.S. PATENT DOCUMENTS 8,237,360 B2 *  8/2012  Kinoshita .......... H01L 51/5265
                                                         257/40
2006/0017337 A1    1/2006  Ryu
(Continued)

FOREIGN PATENT DOCUMENTS

KR    10-2006-0007899    1/2006
KR    10-2006-0103112    9/2006
(Continued)

OTHER PUBLICATIONS

Non-Final Office Action dated Mar. 17, 2017, in U.S. Appl. No. 14/966,629.
(Continued)

*Primary Examiner* — Mohammed Shamsuzzaman
(74) *Attorney, Agent, or Firm* — H.C. Park & Associates, PLC

(57) ABSTRACT

A method for manufacturing an organic light emitting diode display includes: forming a hole injection layer on a substrate formed with a pixel circuit; forming a first assistance layer and a second assistance layer on the hole injection layer, the first assistance layer and the second assistance layer being disposed on different positions of the hole injection layer; forming a first organic emission layer on the first assistance layer; and forming a first hole transporting layer on the second assistance layer.

17 Claims, 14 Drawing Sheets

(52) U.S. Cl.
CPC ...... *H01L 51/5265* (2013.01); *H01L 27/3216* (2013.01); *H01L 2251/558* (2013.01)

(56) References Cited

U.S. PATENT DOCUMENTS

| | | | |
|---|---|---|---|
| 2006/0138945 A1* | 6/2006 | Wolk | H01L 27/3211 313/506 |
| 2006/0214573 A1 | 9/2006 | Maeda et al. | |
| 2011/0101398 A1* | 5/2011 | Uchida | H01L 27/3211 257/98 |
| 2011/0233528 A1* | 9/2011 | Levermore | H01L 27/3213 257/40 |
| 2012/0001207 A1 | 1/2012 | Lee et al. | |
| 2013/0092972 A1 | 4/2013 | Kim et al. | |
| 2013/0105778 A1* | 5/2013 | Kim | H01L 27/3213 257/40 |
| 2014/0061595 A1* | 3/2014 | Kim | H01L 27/3244 257/40 |
| 2014/0070176 A1* | 3/2014 | Bae | H01L 51/52 257/40 |
| 2014/0361272 A1* | 12/2014 | Joo | H01L 51/5056 257/40 |
| 2014/0374707 A1* | 12/2014 | Seo | H01L 27/3211 257/40 |
| 2015/0069341 A1 | 3/2015 | Kim | |
| 2017/0033306 A1* | 2/2017 | Song | H01L 51/5265 |

FOREIGN PATENT DOCUMENTS

| | | |
|---|---|---|
| KR | 10-2012-0002142 | 1/2012 |
| KR | 10-2013-0040574 | 4/2013 |

OTHER PUBLICATIONS

Final Office Action dated Aug. 29, 2017, in U.S. Appl. No. 14/966,629.
Notice of Allowance dated Apr. 16, 2018, in U.S. Appl. No. 14/966,629.

* cited by examiner

ORGANIC LIGHT EMITTING DIODE DISPLAY AND MANUFACTURING METHOD THEREOF

CROSS-REFERENCE TO RELATED APPLICATION

This application is a Continuation of U.S. patent application Ser. No. 14/966,629, filed on Dec. 11, 2015, which claims priority from and the benefit of Korean Patent Application No. 10-2015-0106759, filed on Jul. 28, 2015, which is hereby incorporated by reference for all purposes as if fully set forth herein.

BACKGROUND

Field

The present disclosure relates generally to an organic light emitting diode display and a manufacturing method thereof. More particularly, exemplary embodiments relate generally to an organic light emitting diode display including two organic light emitting elements respectively emitting light of two blues having different wavelengths, along with a method for manufacturing an organic light emitting diode display.

Discussion of the Background

A display device is a device that displays an image. Recently, an organic light emitting diode display has garnered much attention.

An organic light emitting diode (OLED) display has a self-luminous characteristic. Since the organic light emitting diode display does not need a separate light source, such as a backlight unit required by a liquid crystal display (LCD), an OLED device can be relatively thin and lightweight in comparison with an LCD device. In addition, the organic light emitting diode display exhibits other beneficial characteristics, such as low power consumption, high luminance, high response speed, etc.

In general, the organic light emitting diode display includes an organic light emitting element configured to emit light having different wavelengths for every pixel as a minimum unit displaying an image. The organic light emitting element includes a first electrode, an organic layer emitting light, and a second electrode that are sequentially deposited, in which case, the organic layer is deposited on the first electrode by using a mask.

Particularly, in the case of the blue element among the organic light emitting elements, blue visible rays having a wavelength region of about 380 nm to 490 nm are emitted. Since the blue visible rays are part of a short wavelength region that belongs to a relatively high energy visible ray band, when the eye is continuously exposed to blue visible rays, free radicals in the eye are increased, resulting in deteriorated vision.

Accordingly, there exists a need for a user-friendly organic light emitting diode display having high resolution and high pixel life cycle, while reducing, minimizing, or preventing vision deterioration due to the blue visible rays.

The above information disclosed in this Background section is only for enhancement of understanding of the background of the inventive concept, and, therefore, it may contain information that does not form the prior art that is already known a person of ordinary skill in the art.

SUMMARY

Exemplary embodiments provide a user-friendly organic light emitting diode display having high resolution, high color reproducibility (high color gamut), and high element efficiency, while reducing, minimizing, or preventing vision deterioration due to the blue visible ray by forming two kinds organic light emitting elements respectively emitting two types of blue rays having different wavelengths, without increasing the mask for depositing the organic layer.

Additional aspects will be set forth in the detailed description which follows, and, in part, will be apparent from the disclosure, or may be learned by practice of the inventive concept.

An exemplary embodiment discloses an organic light emitting diode display including: a first organic light emitting element configured to emit light corresponding to a first wavelength region; a second organic light emitting element configured to emit light corresponding to a second wavelength region, the center wavelength of the second wavelength region being shorter than the center wavelength of the first wavelength region; a third organic light emitting element configured to emit light corresponding to a third wavelength region, the center wavelength of the third wavelength region being longer than the center wavelength of the first wavelength region; a fourth organic light emitting element configured to emit light corresponding to a fourth wavelength region, the center wavelength of the fourth wavelength region being longer than the center wavelength of the third wavelength region; and a hole injection layer disposed under the first organic light emitting element, the second organic light emitting element, the third organic light emitting element, and the fourth organic light emitting element. The first organic light emitting element includes a first assistance layer disposed on the hole injection layer, and the fourth organic light emitting element includes a second assistance layer disposed on the hole injection layer.

An exemplary embodiment also discloses a method for manufacturing an organic light emitting diode display including: forming a hole injection layer on a substrate formed with a pixel circuit; forming a first assistance layer and a second assistance layer on the hole injection layer, the first assistance layer and the second assistance layer being disposed on different positions of the hole injection layer; forming a first organic emission layer on the first assistance layer; and forming a first hole transporting layer on the second assistance layer.

An exemplary embodiment further discloses an organic light emitting diode display including: a first organic light emitting element configured to emit light corresponding to a first wavelength region; a second organic light emitting element configured to emit light corresponding to a second wavelength region, the center wavelength of the second wavelength region being shorter than the center wavelength of the first wavelength region; a third organic light emitting element configured to emit light corresponding to a third wavelength region, the center wavelength of the third wavelength region being longer than the center wavelength of the first wavelength region; a fourth organic light emitting element configured to emit light corresponding to a fourth wavelength region, the center wavelength of the fourth wavelength region being longer than the center wavelength of the third wavelength region; and a hole injection layer disposed under the first organic light emitting element, the second organic light emitting element, the third organic light emitting element, and the fourth organic light emitting element. The first organic light emitting element and the fourth organic light emitting element each includes an assistance layer, and the fourth organic light emitting element includes a hole transporting layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
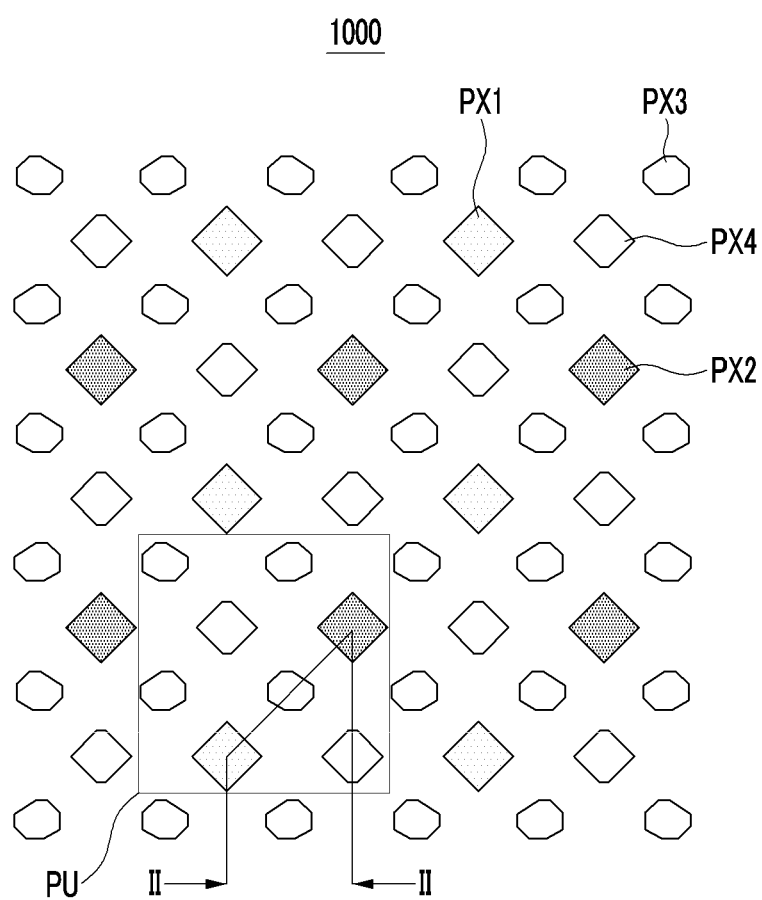
FIG. 1 is a top plan view illustrating an arrangement structure in which pixels are disposed in a first shape in an organic light emitting diode display according to a first exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, an organic light emitting diode display according to a first exemplary embodiment will be described with reference to FIG. 1 and FIG. 5.

FIG. 1 is a top plan view illustrating an arrangement structure in which pixels are disposed in a first shape in an organic light emitting diode display according to the first exemplary embodiment.

Referring to FIG. 1, the organic light emitting diode display 1000 includes a first pixel PX1, a second pixel PX2, a third pixel PX3, and a fourth pixel PX4. Here, the pixel may refer to a minimum unit for displaying an image. The first pixel PX1, the second pixel PX2, the third pixel PX3, and the fourth pixel PX4 are respectively sub-pixels, and each of the first pixel PX1, the second pixel PX2, the third pixel PX3, and the fourth pixel PX4 may be arranged with a pattern (e.g., as shown in FIG. 1). As shown in FIG. 1, the number of each of the first pixel PX1, the second pixel PX2, the third pixel PX3, and the fourth pixel PX4 is plural. The first pixel PX1, the second pixel PX2, the third pixel PX3, and the fourth pixel PX4 may constitute one pixel, however it is not limited thereto, and the first pixel PX1, the second pixel PX2, the third pixel PX3, and the fourth pixel PX4 may selectively constitute one pixel.

FIG. 1 is a schematic diagram in the case of viewing the organic light emitting diode display 1000 from the direction perpendicular to the front surface of the organic light emitting diode display 1000, and the first pixel PX1, the second pixel PX2, the third pixel PX3, and the fourth pixel PX4 respectively include an organic light emitting element, thereby emitting light corresponding to each wavelength region in the shape shown in FIG. 1. More specifically, the first pixel PX1 to the fourth pixel PX4 shown in FIG. 1 respectively represent the region in which the light corresponding to each wavelength region is emitted by each organic light emitting element.

In more detail, the first pixel PX1 may be configured to emit blue light and includes a first organic light emitting element configured to emit blue light and a pixel circuit connected to the first organic light emitting element. The blue light emitted by the first pixel PX1 may be a sky blue color having a first wavelength region of 459 nm to 490 nm; however the wavelength range is not limited thereto as long as the first pixel PX1 emits longer wavelength blue light in comparison with the second pixel PX2.

The second pixel PX2 may also be configured to emit blue light and includes a second organic light emitting element configured to emit blue light and a pixel circuit, connected to the second organic light emitting element. However, the blue light emitted by the second pixel PX2 may be a deep blue color having a second wavelength region of 440 nm to 458 nm; but the wavelength range is not limited thereto as long as the second pixel PX2 emits shorter wavelength blue light in comparison with the first pixel PX1.

The third pixel PX3 may be configured to emit green light having a third wavelength region and includes a third organic light emitting element configured to emit green light and the pixel circuit connected to the third organic light emitting element.

The fourth pixel PX4 may be configured to emit red light having a fourth wavelength region and includes a fourth organic light emitting element configured to emit red light and the pixel circuit connected to the fourth organic light emitting element.

As shown in FIG. 1, the number of third pixels PX3 in a unit area may be greater than the number of fourth pixels PX4 in the unit area. Further, the number of fourth pixels PX4 in the unit area may be greater than the number of first pixels PX1 in the unit area or the number of second pixels PX2 in the unit area. For example, without limiting thereto, one pixel unit PU may include one first pixel PX1, one second pixel PX2, four third pixels PX3, and two fourth pixels PX4.

Further, in the first exemplary embodiment, the pixel arrangement of the organic light emitting diode display 1000 may be the same as the first shape below.

With reference to the left top portion of FIG. 1, two or more third pixels PX3 are disposed to be separated with a predetermined interval in the first row, the fourth pixel PX4 and the first pixel PX1 are alternately disposed in the second row adjacent thereto, two or more third pixels PX3 are disposed to be separated with a predetermined interval in the third row adjacent thereto, the second pixel PX2 and the fourth pixel PX4 are alternately disposed in the fourth row adjacent thereto, and the arrangement of the first row to the fourth row are repeated until the N-th row (N is a natural number). In this case, the first and second pixels PX1 and PX2 emitting blue light and the fourth pixel PX4 emitting red light are formed to be larger than the third pixel PX3 emitting green light.

Further, the one or more third pixel PX3 disposed in the first row and the one or more first pixel PX1 and the one or more fourth pixel PX4 disposed in the second row are alternately arranged. More specifically, with reference to the left top portion of FIG. 1, two or more third pixels PX3 are disposed to be separated with a predetermined interval in the first column, the fourth pixel PX4 and the second pixel PX2 are alternately disposed in the second column adjacent thereto, two or more third pixels PX3 are disposed to be separated with a predetermined interval in the third column adjacent thereto, the first pixel PX1 and the fourth pixel PX4 are alternately disposed in the fourth column adjacent thereto, and this pixel arrangement is repeated until the M-th column (M is a natural number). As shown in FIG. 1, according to the first exemplary embodiment, if it is assumed that the pixel 101 corresponding to a third pixel PX3 is set as the first row and the first column, the third pixels PX3 may be arranged only in odd rows and odd columns. The first pixels PX1 may be arranged only in 2(2n−1) rows and 4n columns (n is a natural number). The second pixels PX2 may be arranged only in 4m rows and 2(2m−1) columns (m is a natural number). The fourth pixels PX4 may be arranged in 2(2p−1) rows and 2(2p−1) columns and arranged in 4p rows and 4p columns.

The organic light emitting diode display 1000 according to the first exemplary embodiment has a pixel arrangement structure in which the pixels are disposed in the above-described first shape and it is applied with a rendering driving displaying the color while sharing the adjacent pixels, thereby realizing high resolution through a small number of pixels.

The first pixel PX1 and the second pixel PX2 may be controlled by a pixel controller (not shown) to respectively emit visible blue rays having different wavelength regions, thereby realizing the pixel driving of the further various methods.

For example, the organic light emitting diode display 1000 may be driven in a first driving mode by driving all of the first pixel PX1, the second pixel PX2, the third pixel PX3, and the fourth pixel PX4. In the first driving mode, the image may be displayed with high visibility and high emission efficiency, thereby being suitable for using the organic light emitting diode display 1000 in an outdoor environment, such as a place located outside a building where enough sun rays are available.

The organic light emitting diode display 1000 may be driven in a second driving mode by driving only the first pixel PX1, the third pixel PX3, and the fourth pixel PX4, without driving the second pixel PX2. Since a first wavelength region of 459 nm to 490 nm as the blue wavelength region having the relatively long displayed visible blue ray corresponds to the wavelength region that is not harmful to vision, it may be suitable for the case of watching the organic light emitting diode display 1000 for a long time or the case in which an user of the organic light emitting diode display 1000 is a child or other people who require more sensitive vision protection. The second driving mode may be relatively effective for protection of the user's vision.

Also, the organic light emitting diode display 1000 may be driven in a third driving mode by driving only the second pixel PX2, the third pixel PX3, and the fourth pixel PX4, without driving the first pixel PX1. In this case, the organic light emitting diode display 1000 may provide high color reproducibility, and the third driving mode may be effective to be used for work requiring high color reproducibility.

Figure 2:
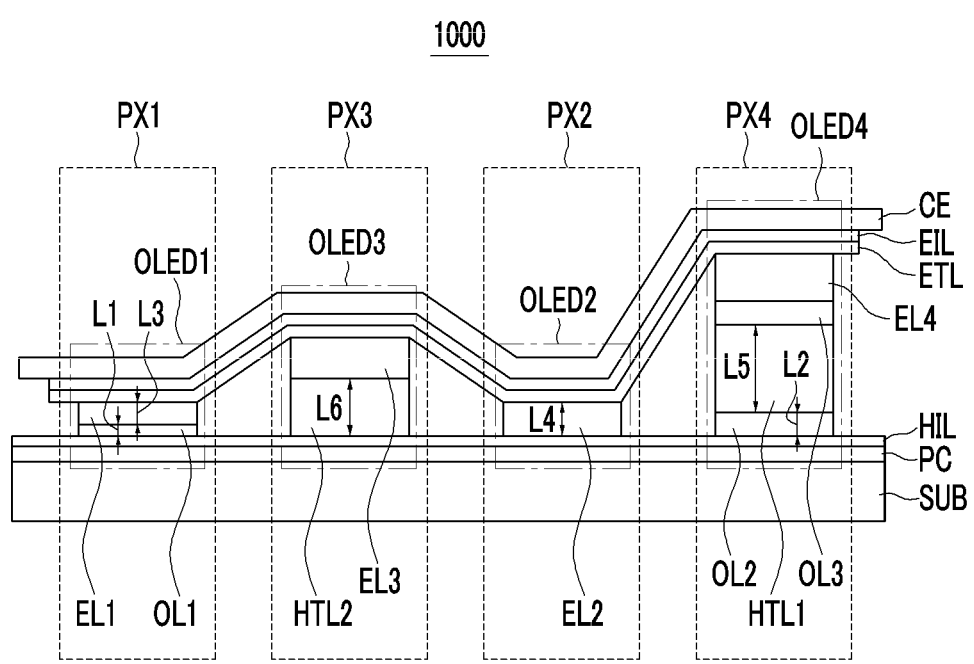
FIG. 2 is a cross-sectional view of the organic light emitting diode display of FIG. 1 taken along section line II-II.

FIG. 2 is a cross-sectional view of the organic light emitting diode display of FIG. 1 taken along section line II-II.

As shown in FIG. 2, the first pixel PX1, the second pixel PX2, the third pixel PX3, and the fourth pixel PX4 respectively include a first organic light emitting element OLED1, a second organic light emitting element OLED2, a third organic light emitting element OLED3, and a fourth organic light emitting element OLED4, and the first organic light emitting element OLED1, the second organic light emitting element OLED2, the third organic light emitting element OLED3, and the fourth organic light emitting element OLED4 each commonly have a structure in which a substrate SUB, a pixel circuit PC, a first electrode (not shown), a hole injection layer HIL, an organic emission layer, an electron transporting layer ETL, an electron injection layer EIL, and a common electrode CE are sequentially deposited.

However, in the organic light emitting diode display 1000 according to the first exemplary embodiment, the first assistance layer OL1 may be formed between the hole injection layer HIL and the first organic emission layer EL1 on the first pixel PX1, and the second assistance layer OL2 may be formed between the hole injection layer HIL and the fourth organic emission layer EL4 on the fourth pixel PX4.

In addition, the first hole transporting layer HTL1 may be further formed between the hole injection layer HIL and the fourth organic emission layer EL4, and the third assistance layer OL3 may be further formed between the first hole transporting layer HTL1 and the fourth organic emission layer EL4.

Further, the second hole transporting layer HTL2 may be further formed between the hole injection layer HIL and the third organic emission layer EL3.

The substrate SUB may be flexible, stretchable, foldable, bendable, or rollable, and as a result, the entire flexible display panel FD may be flexible, stretchable, foldable, bendable, or rollable. The substrate SUB may be flexible, stretchable, foldable, bendable, or rollable, such that the entire organic light emitting diode display 1000 may be flexible, stretchable, foldable, bendable, or rollable.

The pixel circuit PC may be disposed on the substrate SUB, and the first pixel PX1, the second pixel PX2, the third pixel PX3, and the fourth pixel PX4 are connected to organic light emitting elements OLED1, OLED2, OLED3, and OLED4, respectively. The pixel circuit PC may include a wiring including at least one scan line, data line, driving power source line, common power source line, two or more thin film transistors, and at least one capacitor that are connected to the wiring corresponding to one organic light emitting element. The pixel circuit PC may have disclosed various structures.

The first electrode (not shown) may be formed between the pixel circuit PC and the hole injection layer HIL to be connected to the pixel circuit PC and may be an anode that is a hole injection electrode. The first pixel PX1, the second pixel PX2, the third pixel PX3, and the fourth pixel PX4 may be connected to four different first electrodes (not shown), respectively. The first electrode (not shown) may be disposed to be separated from the first organic light emitting element OLED1 to fourth organic light emitting element OLED4. For example, pieces of the first electrode for the first organic light emitting element OLED1, the second organic light emitting element OLED2, the third organic light emitting element OLED3, and the fourth organic light emitting element OLED4 may be separated from each other.

The hole injection layer HIL may be disposed on each of the first electrodes (not shown) and may be positioned under the first organic light emitting element OLED1, the second organic light emitting element OLED2, the third organic light emitting element OLED3, and the fourth organic light emitting element OLED4 and has a shape that integrally extends corresponding to each of the organic light emitting elements OLED1, OLED2, OLED3, and OLED4, as shown in FIG. 2. The hole injection layer HIL serves to facilitate the holes injected from each of the first electrodes (not shown) of the anode to be smoothly injected to the corresponding one of the main emission layers, e.g., the first, second, third and fourth organic emission layers EL1, EL2, EL3, and EL4.

The hole injection layer HIL may include a P-type hole injection layer (not shown) contacting the first electrodes (not shown) and doped with a P-type. As the P-type hole injection layer (not shown) is doped with the P-type, the hole from the first electrode (not shown) may be easily injected to the main emission layers.

The electron transporting layer ETL may be disposed on the first organic emission layer EL1, the second organic emission layer EL2, the third organic emission layer EL3, and the fourth organic emission layer EL4 corresponding to the first organic light emitting element OLED1, the second organic light emitting element OLED2, the third organic light emitting element OLED3, and the fourth organic light emitting element OLED4, respectively, and may have a shape that entirely extends over the first organic light emitting element OLED1, the second organic light emitting element OLED2, the third organic light emitting element OLED3, and the fourth organic light emitting element OLED4. The electron transporting layer ETL serves to facilitate the electrons injected from a common electrode CE having a function of a cathode, which will be described later, to be smoothly injected to each of the organic emission layers.

Further, the electron injection layer EIL may be positioned on the electron transporting layer ETL and may have a shape that entirely extends over the first organic light emitting element OLED1, the second organic light emitting element OLED2, the third organic light emitting element OLED3, and the fourth organic light emitting element OLED4.

The common electrode CE may be the cathode as the electron injection electrode. The common electrode CE may be entirely formed over the first organic light emitting element OLED1, the second organic light emitting element OLED2, the third organic light emitting element OLED3, and the fourth organic light emitting element OLED4.

The common electrode CE may include a metal thin film such as magnesium (Mg), copper (Cu), aluminum (Al), silver Ag), a metal thin film made of an alloy including two or more metals such as a magnesium (Mg)-silver (Ag) alloy, calcium (Ca)-silver (Ag), a metal oxide such as indium tin oxide (ITO), indium zinc oxide (IZO), zinc oxide (ZnO), tin oxide (SnO), aluminum tin oxide (AlTO), a metal thin film doped with the metal oxide, or a light transmittance conductive material or a light semi-transmittance conductive material including a conductive polymer electrode or made of a single layer or multiple layers.

The first organic light emitting element OLED1 emits blue light having a first wavelength region that may be 459 nm to 490 nm and may be formed of a structure in which the first electrode (not shown), the hole injection layer HIL, the first assistance layer OL1, the first organic emission layer EL1, the electron transporting layer ETL, the electron injection layer EIL, and the common electrode CE are sequentially deposited on the pixel circuit PC.

The first organic emission layer EL1 may include blue emission material to emit the visible blue rays and may be formed to have a third thickness L3. The blue emission material may emit the visible blue rays of the deep blue color having the second wavelength region as 440 nm to 458 nm.

However, in the case of the first exemplary embodiment, by controlling the thicknesses of the hole injection layer HIL and the first assistance layer OL1, the blue visible ray having the first wavelength region of 459 nm to 490 nm may be controlled to be emitted.

The first assistance layer OL1 may be disposed between the first organic emission layer EL1 and the hole injection layer HIL. The first assistance layer OL1 includes an organic or inorganic polymer and is a material having conductivity, or may be formed to have the first thickness L1. By controlling the range of the first thickness L1, the first assistance layer OL1 may control the wavelength region for the blue light emitted from the first organic emission layer EL1 to have the wavelength region of 459 nm to 490 nm.

The first assistance layer OL1 may have, for example, the thickness of greater than 0 and less than 20 nm, preferably greater than 0 and less than 10.7 nm, however it is not limited thereto, and the thickness may be designed depending on the thickness of the hole injection layer HIL.

As described above, by controlling the thickness of the hole injection layer HIL and the first assistance layer OL1, in the first pixel PX1, the distance from the hole injection layer HIL to the common electrode CE may be formed to correspond to an optimization distance in which a constructive interference is generated by corresponding to the blue light emitted by the first organic emission layer EL1 and having the first wavelength region.

Figure 3:
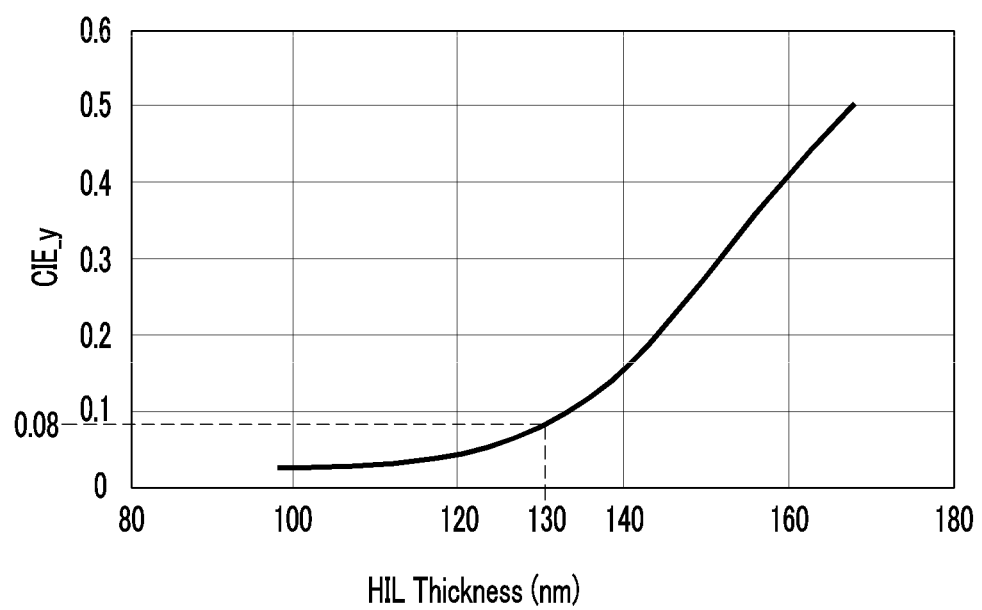
FIG. 3 is a graph showing the correlation between a thickness of a hole injection layer and a y-axis (CIE_y) of a CIE chromaticity diagram according to the first exemplary embodiment.

FIG. 3 is a graph showing a correlation between a thickness of a hole injection layer and an y-axis (CIE_y) of a CIE chromaticity diagram according to the first exemplary embodiment. FIG. 3 shows a color change on the CIE chromaticity diagram for each thickness of the hole injection layer HIL, for example, when the thickness of the first assistance layer OL1 is about 10.7 nm.

FIG. 3, as one example in which the thickness of the hole injection HIL affects to the wavelength of the blue light emitted by the first organic emission layer EL1 like the thickness of the first assistance layer OL1, is a graph showing the correlation between the thickness of the hole injection layer HIL and the CIE_y when the thickness of the first assistance layer OL1 is formed of 10.7 nm. That is, unlike FIG. 3, although the thickness of the first assistance layer OL1 is variously controlled, a tendency represented by the graph between the thickness of the hole injection layer HIL and the CIE_y is the same as FIG. 3.

Referring to FIG. 3, the relation of the thickness of the hole injection layer HIL and the CIE_y represents the correlation of a right-upward curved line. In the first exemplary embodiment, by forming the thickness of the first assistance layer OL1 with 10.7 nm, the correlation like in FIG. 3 may be obtained. In this case, to obtain the visible blue rays emitted from the first organic emission layer EL1 to be 0.08 as a value corresponding to sky blue on the CIE_y, the thickness of the hole injection layer HIL may be controlled with 120 nm to 140 nm, for example, about 130 nm.

As described above, in the organic light emitting diode display 1000 according to the first exemplary embodiment, by controlling the thickness of the hole injection layer HIL and the thickness of the first assistance layer OL1, the wavelength region may be controlled for the visible blue rays emitted from the first organic emission layer EL1 to have the first wavelength region, not the second wavelength region.

The second organic light emitting element OLED2 is configured to emit the second blue light having 440 nm to 458 nm as the short second wavelength region in comparison with the above-described first wavelength region, and may be formed of the structure in which the first electrode (not shown), the hole injection layer HIL, the second organic emission layer EL2, the electron transporting layer ETL, the electron injection layer EIL, and the common electrode CE are sequentially deposited on the pixel circuit PC.

The second organic emission layer EL2 may emit the visible blue rays by including the blue emission material and may be formed to have a fourth thickness L4. The blue emission material may emit the visible blue rays of the deep blue color having the second wavelength region as the wavelength region of 440 nm to 458 nm. That is, the same blue emission material as described above for the first organic emission layer EL1 may be included.

In the second pixel PX2, the distance from the hole injection layer HIL to the common electrode CE may be formed to correspond to the optimization distance in which the constructive interference is generated corresponding to the blue light having the second wavelength region emitted by the second organic emission layer EL2.

In the first exemplary embodiment, since the second organic emission layer EL2 and the first organic emission layer EL1 may be made of the same material, the first organic emission layer EL1 and the second organic emission layer EL2 may be simultaneously stacked by using one mask. In this case, the third thickness L3, as the thickness of the first organic emission layer EL1, and the fourth thickness L4, as the thickness of the second organic emission layer EL2, may be determined to be equal to each other.

In general, in the process of forming the organic emission layers, in order to form different organic emission layers, different masks are used when forming each organic emission layer. If the blue emission materials as an emission source for the first organic emission layer and the second organic emission layer are different, two mask processes are used.

However, in the organic light emitting diode display 1000 according to the first exemplary embodiment, the first organic emission layer EL1 and the second organic emission layer EL2 having the same material may be simultaneously formed by using one mask because the first organic emission layer EL1 and the second organic emission layer EL2 have the same material. Further, by controlling the thickness of the first assistance layer OL1 and the thickness of the hole injection layer HIL to control the wavelength region substantially emitted by the first organic emission layer EL1, two OLEDS, the OLED1 including the organic emission layer EL1 and the OLED2 including the organic emission layer EL2, having different wavelength regions may be simultaneously formed by only one mask process.

The third organic light emitting element OLED3 is configured to emit the green light having a longer third wavelength in comparison with the first wavelength and may be formed of the structure in which the first electrode (not shown), the hole injection layer HIL, the second hole transporting layer HTL2, the third organic emission layer EL3, the electron transporting layer ETL, the electron injection layer EIL, and the common electrode CE are sequentially deposited on the pixel circuit PC.

The second hole transporting layer HTL2 may be disposed between the third organic emission layer EL3 and the hole injection layer HIL in the third pixel PX3 and may be formed to have a sixth thickness L6. The sixth thickness L6 may be formed, for example, larger than 0 and less than 40 nm, or for example, larger than 0 and less than 38 nm, however it is not limited thereto and may be variously designed depending on the thickness of the hole injection layer HIL and the third organic emission layer EL3. The second hole transporting layer HTL2 serves to easily transport the hole to be injected to the third organic emission layer EL3. The hole is injected to the second hole transporting layer HTL2, through the hole injection layer HIL, from the first electrode (not shown).

The second hole transporting layer HTL2, as shown in FIG. 2, may be positioned between the third organic emission layer EL3 and the hole injection layer HIL in the third pixel PX3. The second hole transporting layer HTL2 may not be formed outside of the boundary of the third pixel PX3, and in a black image display state in which the organic light emitting diode display 1000 according to the first exemplary embodiment is not driven, an unintended micro-current may be prevented from being flowed to the other pixels except for the third pixel PX3 through the pixel circuit PC and the first electrode (not shown).

The third organic emission layer EL3 may include the green emission material to emit the green light having the longer third wavelength region in comparison with the first wavelength region. The third organic emission layer EL3 may have a thicker thickness in comparison with the first and second organic emission layers EL1 and EL2. Further, in the third pixel PX3, the distance from the hole injection layer HIL to the common electrode CE may be configured to correspond to the optimization distance in which the constructive interference is generated by corresponding to the green light having the third wavelength region emitted by the third organic emission layer EL3.

The fourth organic light emitting element OLED4 may be configured to emit the red light having a longer fourth wavelength in comparison with the third wavelength and may be formed of the structure in which the first electrode (not shown), the hole injection layer HIL, the second assistance layer OL2, the first hole transporting layer HTL1, the fourth organic emission layer EL4, the electron transporting layer ETL, the electron injection layer EIL, and the common electrode CE are sequentially deposited on the pixel circuit PC.

In addition, the fourth organic light emitting element OLED4 may further include a third assistance layer OL3 between the first hole transporting layer HTL1 and the fourth organic emission layer EL4.

The second assistance layer OL2 may be disposed between the hole injection layer HIL and the first hole transporting layer HTL1 and has the second thickness L2. The second assistance layer OL2 may be formed of the same conductive material as the above-described first assistance layer OL1, in which case, the second thickness L2 may be formed to have the thickness equal to the first thickness L1. More specifically, the first assistance layer OL1 and the second assistance layer OL2 may be simultaneously formed through one mask process.

In addition, in the fourth pixel PX4, the thickness of the second assistance layer OL2 may be controlled for the distance from the hole injection layer HIL to the common electrode CE to correspond to the optimization distance in which the constructive interference is generated corresponding to the red light having the fourth wavelength region.

The first hole transporting layer HTL1 may be disposed between the fourth organic emission layer EL4 and the second assistance layer OL2 in the fourth pixel PX4 and may be formed to have the fifth thickness L5. The first hole transporting layer HTL1 serves to easily transport the hole injected from the first electrode (not shown) to the fourth organic emission layer EL4. The hole may be injected to the first hole transporting layer HTL1 from the first electrode (not shown) through the hole injection layer HIL.

The first hole transporting layer HTL1 may be formed of the same material as the above-described second hole transporting layer HTL2, in which case, the fifth thickness L5 may be equal to the sixth thickness L6. More specifically, the first hole transporting layer HTL1 and the second hole transporting layer HTL2 may be simultaneously formed through one mask process.

The first hole transporting layer HTL1, as shown in FIG. 2, may be formed only between the fourth organic emission layer EL4 and the hole injection layer HIL corresponding to the fourth pixel PX4. More specifically, the first hole transporting layer HTL1 may not be formed outside of the boundary of the fourth pixel PX4, and in the case of the black image display state in which the organic light emitting diode display 1000 according to the first exemplary embodiment is not driven, an undesired micro-current may be prevented from being flowed to other pixels except for the fourth pixel PX4 through the pixel circuit PC and the first electrode (not shown).

The fourth organic emission layer EL4 includes the red emission material to emit the red light having a longer fourth wavelength region in comparison with the third wavelength region. The fourth organic emission layer EL4 has a thicker thickness than the third organic emission layer EL3, in which case the distance from the hole injection layer HIL of the fourth pixel PX4 to the common electrode CE may be longer than the distance from the hole injection layer HIL of the third pixel PX3 to the common electrode CE. Here, the distance from the hole injection layer HIL of the fourth pixel PX4 to the common electrode CE may be formed to correspond to the optimization distance in which the constructive interference is generated corresponding to the fourth wavelength region emitted by the fourth organic emission layer EL4.

The third assistance layer OL3 may be further formed between the first hole transporting layer HTL1 and the fourth organic emission layer EL4 according to various configurations. The third assistance layer OL3 may be formed, for example, of a thickness less than 10 nm; however the third assistance layer OL3 may be omitted if necessary in certain configurations.

If the thickness of the second assistance layer OL2 is configured to have the same thickness as the first assistance layer OL1 and if the thickness of the first hole transporting layer HTL1 is configured to have the same thickness as the second hole transporting layer HTL2, it may be difficult to satisfy the constructive interference condition for the red light emitted by the fourth pixel PX4.

However, like the organic light emitting diode display 1000 according to the first exemplary embodiment, by further forming the third assistance layer OL3 for controlling the distance from the hole injection layer HIL of the fourth pixel PX4 to the common electrode CE correspond to the optimization distance in which the constructive interference is generated corresponding to the red light having the fourth wavelength region emitted by the fourth organic emission layer EL4, a resonance condition is thereby compensated.

Figure 4:
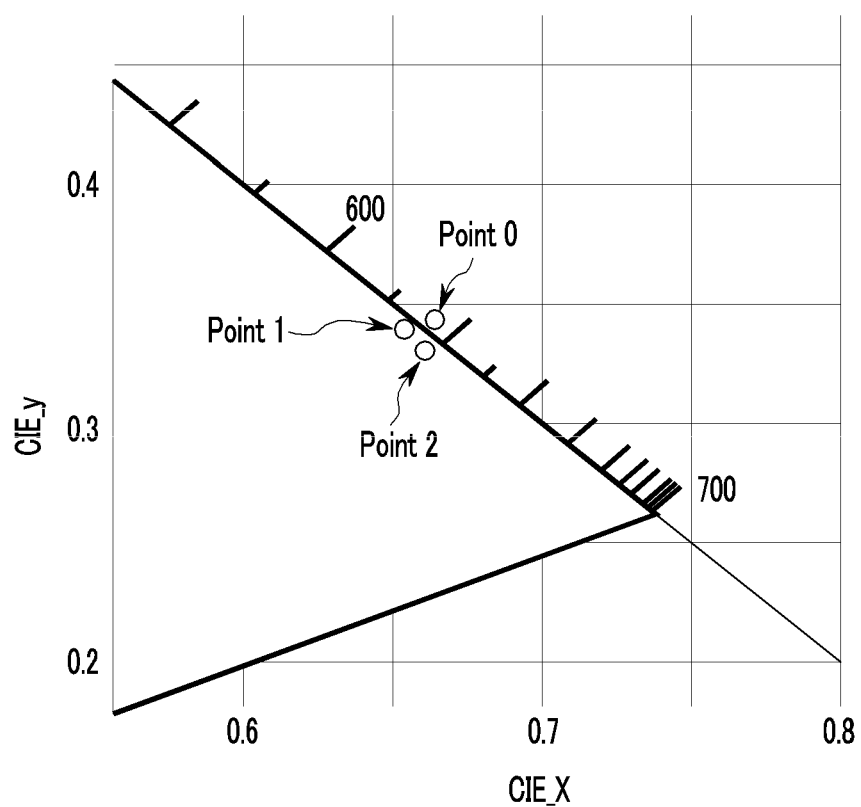
FIG. 4 is a graph showing a position on a CIE chromaticity diagram for each thickness of a third assistance layer as point 1 and point 2 in an organic light emitting diode display according to the first exemplary embodiment.
Figure 5:
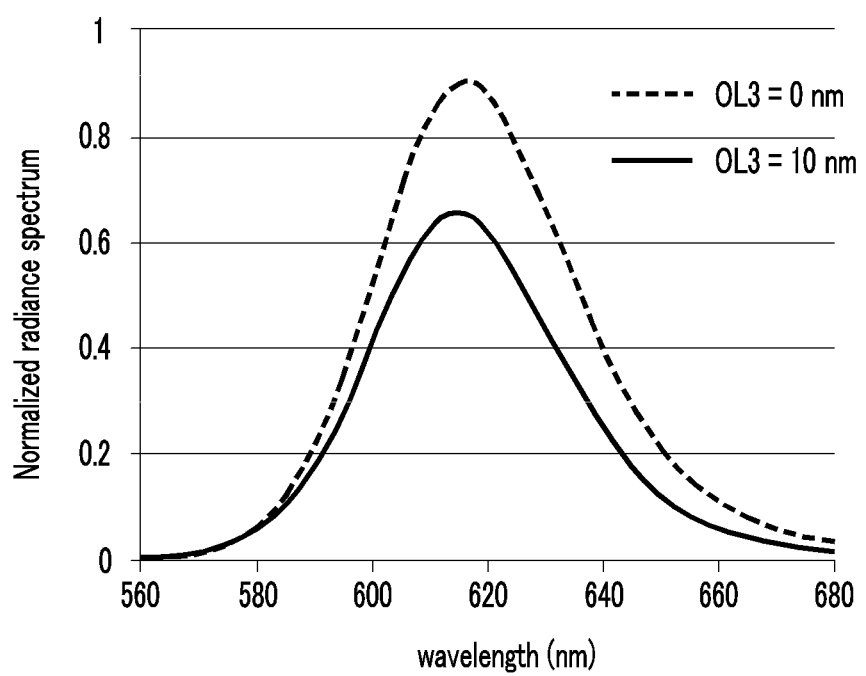
FIG. 5 is a graph showing a normalized radiance spectrum for each wavelength depending on a thickness of a third assistance layer in an organic light emitting diode display according to the first exemplary embodiment.

FIG. 4 is a graph showing a position on a CIE chromaticity diagram for each thickness of a third assistance layer as point 1 and point 2 in an organic light emitting diode display 1000 according to the first exemplary embodiment, and FIG. 5 is a graph showing a normalized radiance spectrum for each wavelength depending on a thickness of a third assistance layer in an organic light emitting diode display according to the first exemplary embodiment.

In FIG. 4, a reference point (point 0) is a position representing the center wavelength of the red light emitted by the conventional red light-emitting diode display on the CIE chromaticity diagram, the first point (point 1) is a position representing the center wavelength of the red light when the third assistance layer OL3 does not exist on the CIE chromaticity diagram, and the second point (point 2) is a position representing the center wavelength of the emitted red light when the thickness of the third assistance layer OL3 is 10 nm on the CIE chromaticity diagram.

In FIG. 5, a normalized radiance spectrum for the wavelength region is indicated by a dotted line graph with the first point (point 1) as the center wavelength, and a normalized radiance spectrum for the wavelength region is indicated by a solid line graph with the second point (point 2) as the center wavelength.

An X-axis of FIG. 4 represents an X-axis (CIE_X) of the CIE chromaticity diagram, a Y-axis represents a Y-axis (CIE_y) of the CIE chromaticity diagram, and a right-downward straight line for which a scale drops represents the wavelength region, and it may be confirmed the reference point (point 0), the first point (point 1), and the second point (point 2) are all positioned between 600 nm to 700 nm of the red light wavelength region.

The first point (point 1) has a center wavelength shorter than the reference point (point 0) and the second point (point 2) has a center wavelength slightly longer than the reference point (point 0); however the difference on the chromaticity diagram appears to be insignificant for users in recognizing red light rays.

In addition, referring to FIG. 5, it may be confirmed that the wavelength region between the dotted line graph with the first point (point 1) as the center wavelength and the solid line graph with the second point (point 2) as the center wavelength are substantially the same, except for a slight difference between the two center wavelengths and the difference of the normalized radiance spectrums.

More specifically, even if the third assistance layer OL3 is further formed, the slight value change of the center wavelength region and the change of the luminance only exist. Thus, the wavelength region of the red light is substantially the same, such that the resonance condition of the red light may be easily compensated by forming the third assistance layer OL3 with a determined thickness to create the resonance condition.

As described above, in the organic light emitting diode display 1000 according to the first exemplary embodiment, by respectively forming the first assistance layer OL1, the second assistance layer OL2, and the third assistance layer OL3, the distance from the hole injection layer HIL in each pixel to the common electrode CE may be controlled such that each layer has the optimization distance in which the light emitted in each pixel generates the constructive interference.

In addition, by controlling the visible blue ray wavelength region of the first organic emission layer EL1 through the first assistance layer OL1, the first and second organic emission layers EL1 and EL2 having different wavelength regions may be simultaneously formed through one mask process, thereby reducing the manufacturing time of the organic light emitting diode display 1000 and the manufacturing cost.

Next, the organic light emitting diode display 2000 according to a second exemplary embodiment will be described with reference to FIG. 6 and FIG. 7. The organic light emitting diode display 2000 according to the second exemplary embodiment includes at least partially the same structure as the organic light emitting diode display 1000 according to the above-described first exemplary embodiment. For example, the organic light emitting diode display 2000 and the organic light emitting diode display 1000 may have the same elements, configurations, structures, and the like, except for the arrangement of the pixels that is formed of the second shape shown in FIG. 6, unlike the above-described first shape in FIG. 1.

Hereinafter, when describing the organic light emitting diode display 2000 according to the second exemplary embodiment, the detailed description for the configurations, elements, structures, etc. described with respect to the first exemplary embodiment will be omitted for conciseness.

Figure 6:
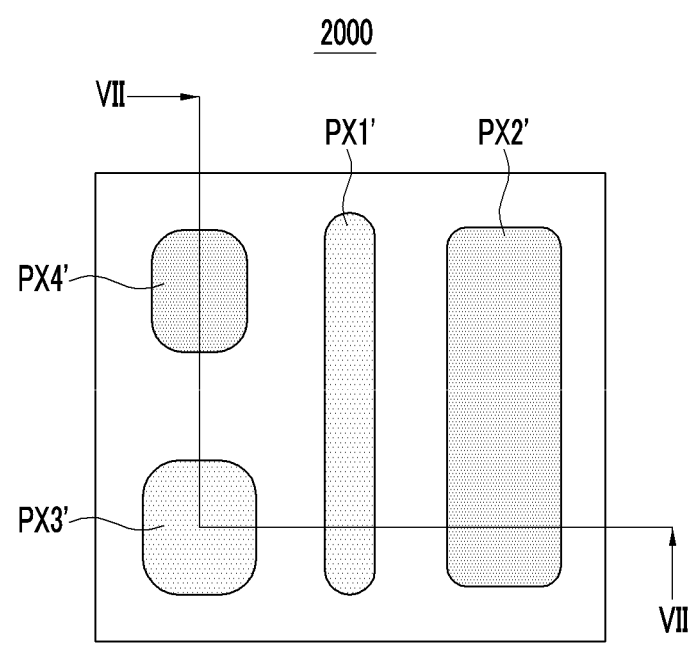
FIG. 6 is a top plan view illustrating an arrangement structure in which pixels are disposed in a second shape in an organic light emitting diode display according to a second exemplary embodiment.
Figure 7:
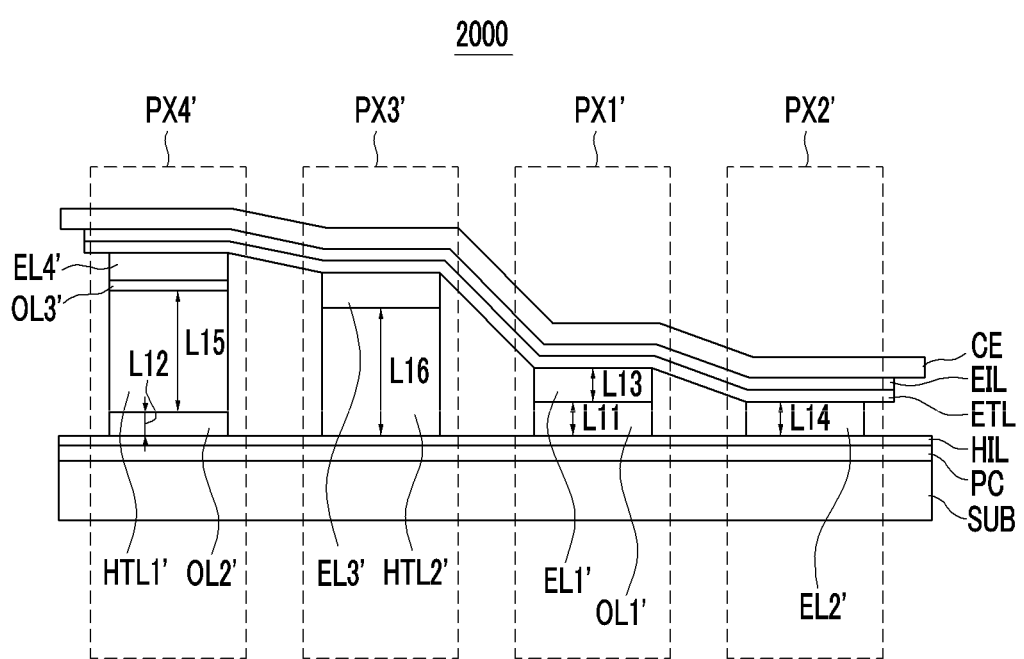
FIG. 7 is a cross-sectional view taken along section line VII-VII of FIG. 6.

FIG. 6 is a top plan view illustrating an arrangement structure in which pixels are disposed in a second shape in an organic light emitting diode display according to a second exemplary embodiment, and FIG. 7 is a cross-sectional view taken along section line VII-VII of FIG. 6.

Referring to FIG. 6, the organic light emitting diode display 2000 according to the second exemplary embodiment includes a first pixel PX1', a second pixel PX2', a third pixel PX3', and a fourth pixel PX4' of the same type as the above-described first exemplary embodiment, however the arrangement of the pixels is different.

FIG. 6 shows the structure in which one first pixel PX1', one second pixel PX2', one third pixel PX3', and one fourth pixel PX4' are respectively disposed, the first pixel PX1' emitting light of the sky blue color is disposed in the center, the second pixel PX2' emitting light of the deep blue color is disposed on the right side of the first pixel PX1', the third pixel PX3' is disposed in the bottom of the left region, which is located on the left side of the first pixel PX1', and the fourth pixel PX4' is disposed in the upper region of the left region with respect to the third pixel PX3'. However, the arrangements are not limited thereto. For example, the third pixel PX3' and the fourth pixel PX4' may be positioned on the right side of the first pixel PX1' and/or the second pixel PX2'.

When defining the arrangement of the first pixel PX1' to the fourth pixel PX4' shown in FIG. 6 as the first row and the first column of one unit arrangement, the organic light emitting diode display 2000 according to the second exemplary embodiment has the structure in which the unit pixels of FIG. 6 are repeated until forming the N-th row and the M-th column (N and M are natural numbers).

The organic light emitting diode display 2000 according to the second exemplary embodiment has the arrangement structure of the second shape in which the pixels shown in FIG. 6 are continuous and repeated as described above, and high resolution with a small number of pixels may be implemented by adopting the rendering driving of sharing adjacent pixels to express colors.

Referring to FIG. 7, each pixel commonly has the structure in which the substrate SUB, the pixel circuit PC, the first electrode (not shown), the hole injection layer HIL, a corresponding organic emission layer, the electron transporting layer ETL, the electron injection layer EIL, and the common electrode CE are sequentially deposited.

However, in the organic light emitting diode display 2000 according to the second exemplary embodiment, the first assistance layer OL1' having a thickness L11 may be formed between the hole injection layer HIL and the first organic emission layer EL1' on the first pixel PX1', and the second assistance layer OL2' having a thickness L12 that is equal to the thickness L11 may be formed between the hole injection layer HIL and the fourth organic emission layer EL4' in the fourth pixel PX4'.

In addition, the first hole transporting layer HTL1' having a thickness L15 may be formed between the hole injection layer HIL and the fourth organic emission layer EL4', and the third assistance layer OL3' may be further formed between the first hole transporting layer HTL1' and the fourth organic emission layer EL4'.

Further, a second hole transporting layer HTL2' having a thickness L16 equal to the fifteenth thickness L15 may be further formed between the hole injection layer HIL and the third organic emission layer EL3'.

The first assistance layer OL1' and the second assistance layer OL2' may be formed through the one mask process like the above-described first exemplary embodiment, and by controlling the thickness of the first assistance layer OL1' and the hole injection layer HIL, the first organic emission layer EL1' may be configured to emit the visible blue rays of the sky blue color having the first wavelength region of 459 nm to 490 nm, not the second wavelength region of 440 nm to 458 nm.

The first organic emission layer EL1' may be formed to have the thickness L13, the second organic emission layer EL2' may be formed to have the thickness L14 equal to the thickness of the thirteenth thickness L13, and the same blue emission material emitting the second wavelength region of 440 nm to 458 nm may be included. Throughout the specification, the same or equal thickness may be substantially the same or equal thickness. For example, a minor thickness difference that can be formed when one material is disposed on different pixels at once but the deposition layers are different in different pixels such as the formation of the first organic emission layer EL1' and the second organic emission layer EL2' may be ignored. Although such a minor thickness difference may exist, the divided structure formed from one mask, e.g., the first organic emission layer EL1' and the second organic emission layer EL2', has substantially the same thickness.

The first organic emission layer EL1' and the second organic emission layer EL2' may be formed through one mask process like the above-described first exemplary embodiment.

The first hole transporting layer HTL1' and the second hole transporting layer HTL2' may be formed to have the same material and the same thickness like the above-described first exemplary embodiment and may be simultaneously formed through one mask process.

Like the above-described first exemplary embodiment, the third assistance layer OL3' may be further formed between the first hole transporting layer HTL1' and the fourth organic emission layer EL4', thereby controlling the distance between hole injection layer HIL of the fourth pixel PX4' and the common electrode CE to satisfy the constructive interference condition for the red light emitted by the fourth pixel PX4'.

As described above, in the case of the organic light emitting diode display 2000 according to the second exemplary embodiment having the second shape of the different pixel arrangement from the first exemplary embodiment, the high color reproducibility (high color gamut), the high element efficiency, and the vision protection of the user from the visible blue rays may all be realized without being bound by the pixel arrangement method.

Next, a manufacturing method of an organic light emitting diode display 1000 according to the first exemplary embodiment will be described with reference to FIG. 8 through FIG. 14.

FIG. 8, FIG. 9, FIG. 10, FIG. 11, FIG. 12, FIG. 13, and FIG. 14 are views sequentially illustrating a manufacturing method of an organic light emitting diode display according to the first exemplary embodiment.

Figure 8:
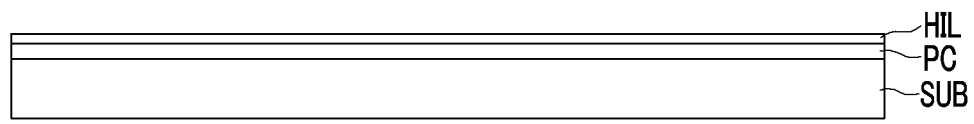
FIG. 8, FIG. 9, FIG. 10, FIG. 11, FIG. 12, FIG. 13, and FIG. 14 are views sequentially illustrating a manufacturing method of an organic light emitting diode display according to the first exemplary embodiment.

Referring to FIG. 8, the hole injection layer HIL may be formed on the pixel circuit PC disposed on the substrate SUB. Although not shown in FIG. 8, a first electrode may be disposed between the pixel circuit PC and the hole injection layer HIL. As an example, the lower layer of the hole injection layer HIL may be formed as the first electrode by having a conductive material.

Figure 9:
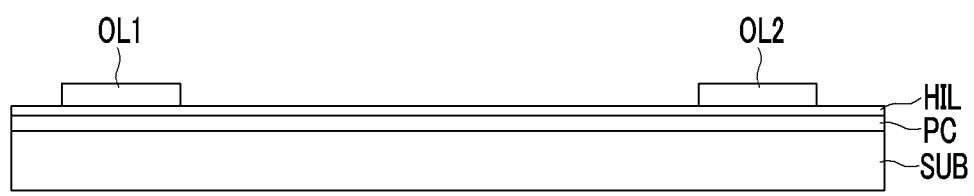

Next, as shown in FIG. 9, the first assistance layer OL1 and the second assistance layer OL2 may be formed to be separated on the hole injection layer HIL. The first assistance layer OL1 and the second assistance layer OL2 may be formed of the same material, including the organic or inorganic polymer and having the same conductivity, and may be formed with the same thickness. In the first exemplary embodiment, through one mask process, as shown in FIG. 9, the first assistance layer OL1 and the second assistance layer OL2 may be simultaneously formed.

Figure 10:
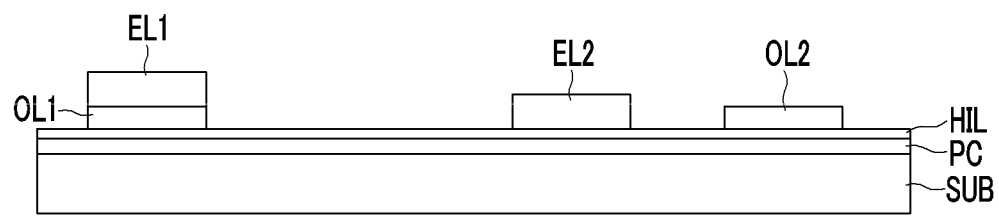

Next, as shown in FIG. 10, the first organic emission layer EL1 may be formed on the first assistance layer OL1. The first organic emission layer EL1 may include the light emission material emitting the blue light corresponding to the second wavelength region of 440 nm to 458 nm. In the first exemplary embodiment, on the hole injection layer HIL, the first organic emission layer EL1 and the second organic emission layer EL2 separated from the first organic emission layer EL1 may be simultaneously formed.

In the first exemplary embodiment, the first organic emission layer EL1 and the second organic emission layer EL2 may be formed to have the same material and the same thickness, and may be simultaneously formed through one mask process.

Figure 11:
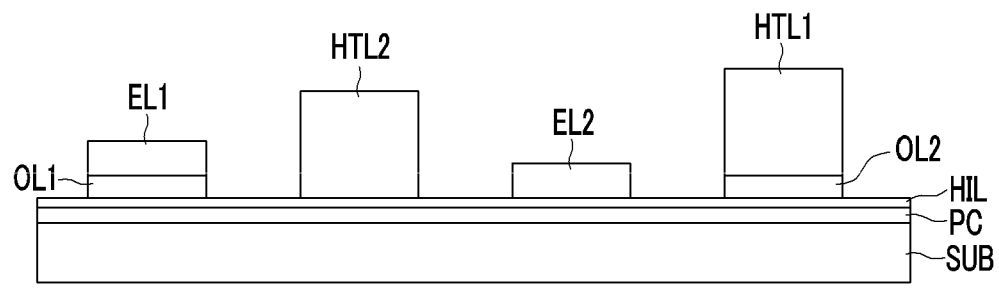

Next, as shown in FIG. 11, the first hole transporting layer HTL1 may be formed on the second assistance layer OL2. In the first exemplary embodiment, along with the first hole transporting layer HTL1, the second hole transporting layer HTL2 may be formed. The second hole transporting layer HTL2 is formed on the hole injection layer HIL; however it may be formed at a position separate from the first hole transporting layer HTL1, the first organic emission layer EL1, and the second organic emission layer EL2. The first hole transporting layer HTL1 and the second hole transporting layer HTL2 may be formed to have the same material and the same thickness, and may be simultaneously formed through one mask process.

Figure 12:
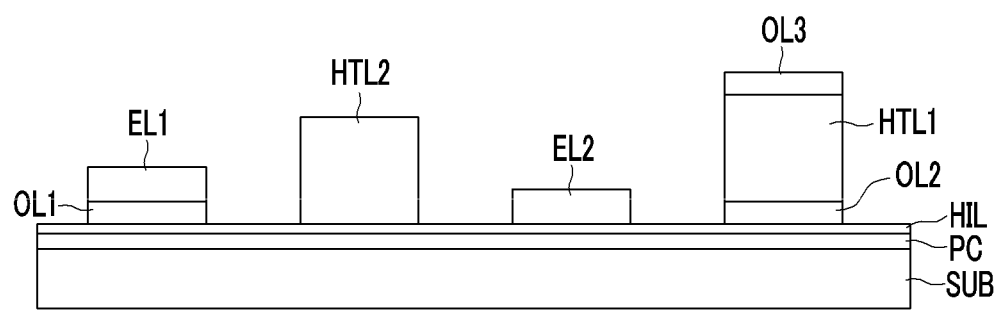

Further, as shown in FIG. 12, the third assistance layer OL3 may be formed on the first hole transporting layer HTL1. As described above, when it is designed so that the light emitted in the first organic light emitting element OLED1, the second light emitting element OLED2, the third light emitting element OLED3, and the fourth organic light emitting element OLED4, respectively, is in a condition that forms resonance through constructive interference, the third assistance layer OL3 may be a controlling factor to compensate the resonance distance of the fourth pixel PX4. However, it may be omitted according to different configuration conditions.

Figure 13:
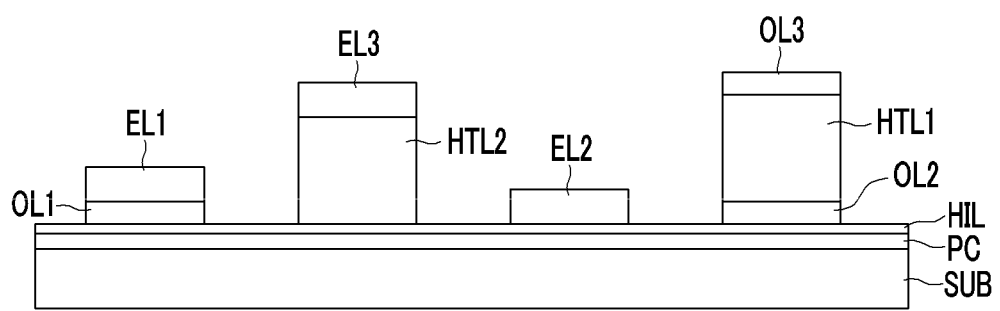
Figure 14:
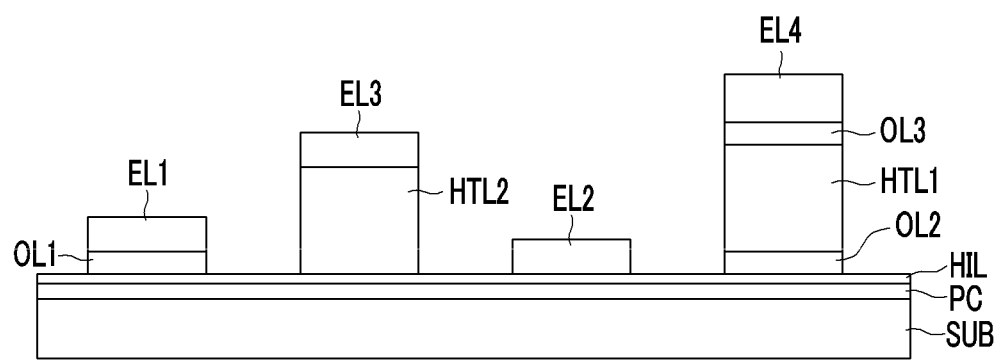

Next, as shown in FIG. 13 and FIG. 14, the third organic emission layer EL3 on the second hole transporting layer HTL2 and the fourth organic emission layer EL4 on the assistance layer OL3 may be respectively formed. When the third assistance layer OL3 is omitted, the fourth organic emission layer EL4 may be formed directly on the first hole transporting layer HTL1.

Next, by sequentially forming the electron transporting layer ETL, the electron injection layer EIL, and the common electrode CE, the organic light emitting diode display 1000 having the structure shown in FIG. 2 may be manufactured.

As described above, in the organic light emitting diode display 1000 according to the first exemplary embodiment and the manufacturing method thereof, although the first organic emission layer EL1 and the second organic emission layer EL2 include the blue emission material emitting blue light of the second wavelength region of 440 nm to 458 nm, by controlling the thickness of the first assistance layer OL1 and the hole injection layer HIL, the first pixel PX1 may be configured to emit blue light corresponding to the first wavelength region of 459 nm to 490 nm.

Also, like the first pixel PX1 and the second pixel PX2, although the kind of pixels emitting different wavelength regions is increased, the mask process is not increased and the first organic emission layer EL1 and the second organic emission layer EL2 may be formed by one mask, thereby providing the organic light emitting diode display 1000 with reduced manufacturing time and cost.

Also, by controlling the distance from each hole injection layer HIL to the common electrode CE to generate the constructive interference in accordance with each light emitted by the first pixel PX1 through the fourth pixel PX4, the organic light emitting diode display 1000 with improved emission efficiency of the pixels is provided.

According to an exemplary embodiment, the organic light emitting elements respectively emitting two blue lights having different wavelengths are included, thereby providing the organic light emitting diode display capable of realizing high color reproducibility (high color gamut) and vision protection for the user from the visible blue rays.

In addition, according to an exemplary embodiment, without increasing the mask depositing the organic layer, the organic light emitting diode display is provided with improved emission efficiency for the plurality of organic light emitting elements emitting light having different wavelengths.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode display comprising:
   a first organic light emitting element configured to emit light corresponding to a first wavelength region;
   a second organic light emitting element configured to emit light corresponding to a second wavelength region, a center wavelength of the second wavelength region being shorter than a center wavelength of the first wavelength region;
   a third organic light emitting element configured to emit light corresponding to a third wavelength region, a center wavelength of the third wavelength region being longer than the center wavelength of the first wavelength region;
   a fourth organic light emitting element configured to emit light corresponding to a fourth wavelength region, a center wavelength of the fourth wavelength region being longer than the center wavelength of the third wavelength region;
   a hole injection layer disposed in the first organic light emitting element, the second organic light emitting element, the third organic light emitting element, and the fourth organic light emitting element;
   assistance layers comprising a first assistance layer disposed on the hole injection layer of the first organic light emitting element and a second assistance layer disposed on the hole injection layer of the fourth organic light emitting element,
   wherein:
   the first assistance layer and the second assistance layer comprise a same conductive material and have a same thickness;
   the fourth organic light emitting element comprises a first hole transporting layer disposed on the hole injection layer; and
   the first hole transporting layer comprises a different material from the first assistance layer and the second assistance layer and has a different thickness from the first assistance layer and the second assistance layer.

2. The organic light emitting diode display of claim 1, wherein:
   the first organic light emitting element comprises a first organic emission layer disposed on the first assistance layer, and
   the second organic light emitting element comprises a second organic emission layer disposed in the second organic light emitting element.

3. The organic light emitting diode display of claim 2, wherein:
   the first organic emission layer and the second organic emission layer comprise a same material.

4. The organic light emitting diode display of claim 1, wherein
the third organic light emitting element comprises a second hole transporting layer disposed in the third organic light emitting element.

5. The organic light emitting diode display of claim 4, wherein:
a thickness of the first hole transporting layer is the same as a thickness of the second hole transporting layer.

6. The organic light emitting diode display of claim 1, wherein:
the fourth organic light emitting element comprises a third assistance layer disposed on the first hole transporting layer.

7. The organic light emitting diode display of claim 6, wherein:
a thickness of the third assistance layer is 10 nm or less.

8. The organic light emitting diode display of claim 1, wherein:
the first organic light emitting element and the second organic light emitting element are configured to emit different blue light.

9. The organic light emitting diode display of claim 8, wherein:
the first wavelength region is 459 nm to 490 nm, and
the second wavelength region is 440 nm to 458 nm.

10. The organic light emitting diode display of claim 9, wherein:
the third organic light emitting element is configured to emit green light, and
the fourth organic light emitting element is configured to emit red light.

11. An organic light emitting diode display comprising:
a first organic light emitting element configured to emit light corresponding to a first wavelength region;
a second organic light emitting element configured to emit light corresponding to a second wavelength region, a center wavelength of the second wavelength region being shorter than a center wavelength of the first wavelength region;
a third organic light emitting element configured to emit light corresponding to a third wavelength region, a center wavelength of the third wavelength region being longer than the center wavelength of the first wavelength region;
a fourth organic light emitting element configured to emit light corresponding to a fourth wavelength region, a center wavelength of the fourth wavelength region being longer than the center wavelength of the third wavelength region; and
a hole injection layer disposed in the first organic light emitting element, the second organic light emitting element, the third organic light emitting element, and the fourth organic light emitting element,
wherein:
each of the first organic light emitting element and the fourth organic light emitting element comprises an assistance layer on the hole injection layer;
the fourth organic light emitting element comprises a hole transporting layer disposed on the hole injection layer; and
the assistance layer of the first organic light emitting element and the assistance layer of the fourth organic light emitting element comprise a same conductive material and have a same thickness.

12. The organic light emitting diode display of claim 11, wherein:
the assistance layer is disposed between a substrate and a common electrode of the first organic light emitting element and the fourth organic light emitting element.

13. The organic light emitting diode display of claim 11, wherein
the hole transporting layer comprises a different material from the assistance layer in the fourth organic light emitting element and has a different thickness from the assistance layer in the fourth organic light emitting element.

14. The organic light emitting diode display of claim 11, wherein:
the first organic light emitting element comprises a first organic emission layer disposed on the assistance layer therein, and the second organic light emitting element comprises a second organic emission layer; and
the first organic emission layer and the second organic emission layer comprise a same material.

15. The organic light emitting diode display of claim 11, wherein:
the first organic light emitting element and the second organic light emitting element are configured to emit different blue light.

16. The organic light emitting diode display of claim 15, wherein:
the first wavelength region is 459 nm to 490 nm, and
the second wavelength region is 440 nm to 458 nm.

17. The organic light emitting diode display of claim 16, wherein:
the third organic light emitting element is configured to emit green light, and
the fourth organic light emitting element is configured to emit red light.

* * * * *